US009153385B2

(12) United States Patent
Yu et al.

(10) Patent No.: US 9,153,385 B2
(45) Date of Patent: Oct. 6, 2015

(54) ELECTRODE STRUCTURE OF THE TOUCH PANEL, METHOD THEREOF AND TOUCH PANEL

(71) Applicant: TPK Touch Solutions (Xiamen) Inc., Xiamen (CN)

(72) Inventors: Jing Yu, Xiamen (CN); Huilin Ye, Xiamen (CN); Rongwu Wang, Longyan (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 0 days.

(21) Appl. No.: 14/184,673

(22) Filed: Feb. 19, 2014

(65) Prior Publication Data
US 2014/0166611 A1    Jun. 19, 2014

Related U.S. Application Data

(62) Division of application No. 13/210,394, filed on Aug. 16, 2011, now Pat. No. 8,698,001.

(30) Foreign Application Priority Data

May 28, 2011    (CN) .......................... 2011 1 0152884

(51) Int. Cl.
H01B 13/00    (2006.01)
H01L 21/28    (2006.01)
H01L 21/44    (2006.01)
H01L 21/302    (2006.01)
H01L 21/461   (2006.01)
H01G 9/048    (2006.01)
H01L 21/04    (2006.01)
G06F 3/044    (2006.01)

(52) U.S. Cl.
CPC ................ *H01G 9/048* (2013.01); *G06F 3/044* (2013.01); *H01L 21/044* (2013.01); *H01L 21/0425* (2013.01); *G06F 2203/04111* (2013.01); *G06F 2203/04112* (2013.01); *H01L 21/048* (2013.01)

(58) Field of Classification Search
None
See application file for complete search history.

(56) References Cited

FOREIGN PATENT DOCUMENTS

EP        1986084 A1 *  9/2007

* cited by examiner

Primary Examiner — Stephanie Duclair
(74) Attorney, Agent, or Firm — Gokalp Bayramoglu

(57) ABSTRACT

An electrode structure is provided. The electrode structure comprises a plurality of first conductive cells and second conductive cells separated from each other and disposed on a substrate; a plurality of first conductive lines connecting adjacent said first conductive cells and a plurality of second conductive lines connecting adjacent said second conductive cells; wherein each said second conductive line comprises a conducting element and a pair of second conductive branches disposed at two sides of said conducting elements and connecting said conducting element to adjacent said second conductive cells; said first conductive lines and said second conductive lines are insulated and intersected. The method of forming an electrode structure is also provided.

15 Claims, 2 Drawing Sheets

ELECTRODE STRUCTURE OF THE TOUCH PANEL, METHOD THEREOF AND TOUCH PANEL

This application is a Divisional Application of Ser. No. 13/210,394, filed Aug. 16, 2011 by the present inventors, Which is incorporated herein by reference.

BACKGROUND OF THE INVENTION

1. Field of the Invention

The present invention relates to a touch device, especially to an electrode structure of the touch panel, the method thereof and the touch panel.

2. Description of the Related Art

The touch panels have been widely used in various electronic devices in recent years. These can even replace the conventional keyboards and mice to control the electronic devices.

The conventional touch panel includes an active area placed on a substrate. The active area is usually covered with transparent conductive film. When the fingers or stylus touch the active area, the touch signals are created for the subsequent processes.

There are many types of touch sensing methods, such as resistive sensing type, capacitive sensing type, acoustic wave sensing type, optical sensing type and the like. For the capacitive sensing method, the touch panel perceives touch locations by detecting the change in capacitance due to the proximity of conductive objects such as metals or fingers. The capacitive touch panel is widely adopted because of the advantages like high rigidity, accuracy and longevity, accurate response time, operating temperature and initializing force.

Various types of touch panels with different electrode patterns are newly developed for detecting the touch locations of the fingers or conductive objects on the touch surface. For example, U.S. Pat. No. 6,970,160 disclosed a lattice touch-sensing system for detecting a position of a touch on a touch-sensitive surface. The lattice touch-sensing system stem may include two capacitive sensing layers, separated by an insulating material, where each layer consists of substantially parallel conducting elements, and the conducting elements of the two sensing layers are substantially orthogonal to each other. Each element may comprise a series of diamond shaped patches that are connected together with narrow conductive rectangular strips. Each conducting element of a given sensing layer is electrically connected at one or both ends to a lead line of a corresponding set of lead lines. A control circuit may also be included to provide an excitation signal to both sets of conducting elements through the corresponding sets of lead lines, to receive sensing signals generated by sensor elements when a touch on the surface occurs, and to determine a position of the touch from the sensing signals.

Although a series of diamond shaped patches of the touch-sensing system are disclosed in above-mentioned patent, the lattice touch-sensing system includes two capacitive sensing layers, separated by an insulating material. Thus, the lattice touch-sensing system is too thick to meet the requirement of reducing the thickness of the capacitive touch panel. Besides, the conventional capacitive touch panel is manufactured by forming the two capacitive sensing layers on the two sides of a substrate and connecting each series of diamond shaped patches with lead lines through the holes on the substrate. Therefore, the manufacturing process is complicated.

SUMMARY OF THE INVENTION

An objective of the present invention is to provide an electrode structure to reduce the thickness of the touch panel and simplify the manufacturing process.

The electrode structure comprises a plurality of first conductive cells and second conductive cells separated from each other and disposed on a substrate; a plurality of first conductive lines connecting adjacent said first conductive cells and a plurality of second conductive lines connecting adjacent said second conductive cells; wherein each said second conductive line comprises a conducting element and a pair of second conductive branches disposed at two sides of said conducting elements and connecting said conducting element to adjacent said second conductive cells; said first conductive lines and said second conductive lines are insulated and intersected.

The other objective of the present invention is to provide a method of forming an electrode structure.

The method of forming an electrode structure comprises: (a) forming a plurality of first conductive cells, a plurality of first conductive lines connecting adjacent said first conductive cells and a plurality of second conductive cells; (b) forming a plurality of conducting elements insulated from said first conductive lines; and (c) forming a plurality of pairs of second conductive branches over said first conductive lines to connect said second conductive cells with said conducting elements.

By means of the present invention, the first conductive cells and the second conductive cells are disposed on the same surface of the substrate, so the thickness of touch panel including the electrode structure is reduced. Moreover, each second conductive line is divided into a conducting element and a pair of second conductive branches, and the length of a pair of second conductive branches is less than the distance between two adjacent second conductive cells. Thus, the visibility of the second conductive lines is reduced to improve the appearance of the touch panel including the electrode structure.

BRIEF DESCRIPTION OF THE DRAWINGS

The skilled artisan will understand that the drawings, described below, are for illustration purposes only. The drawings are not intended to limit the scope of the present teachings in any way. Like reference numerals designate corresponding parts throughout the several views.

DETAILED DESCRIPTION OF THE EMBODIMENTS

Figure 1:
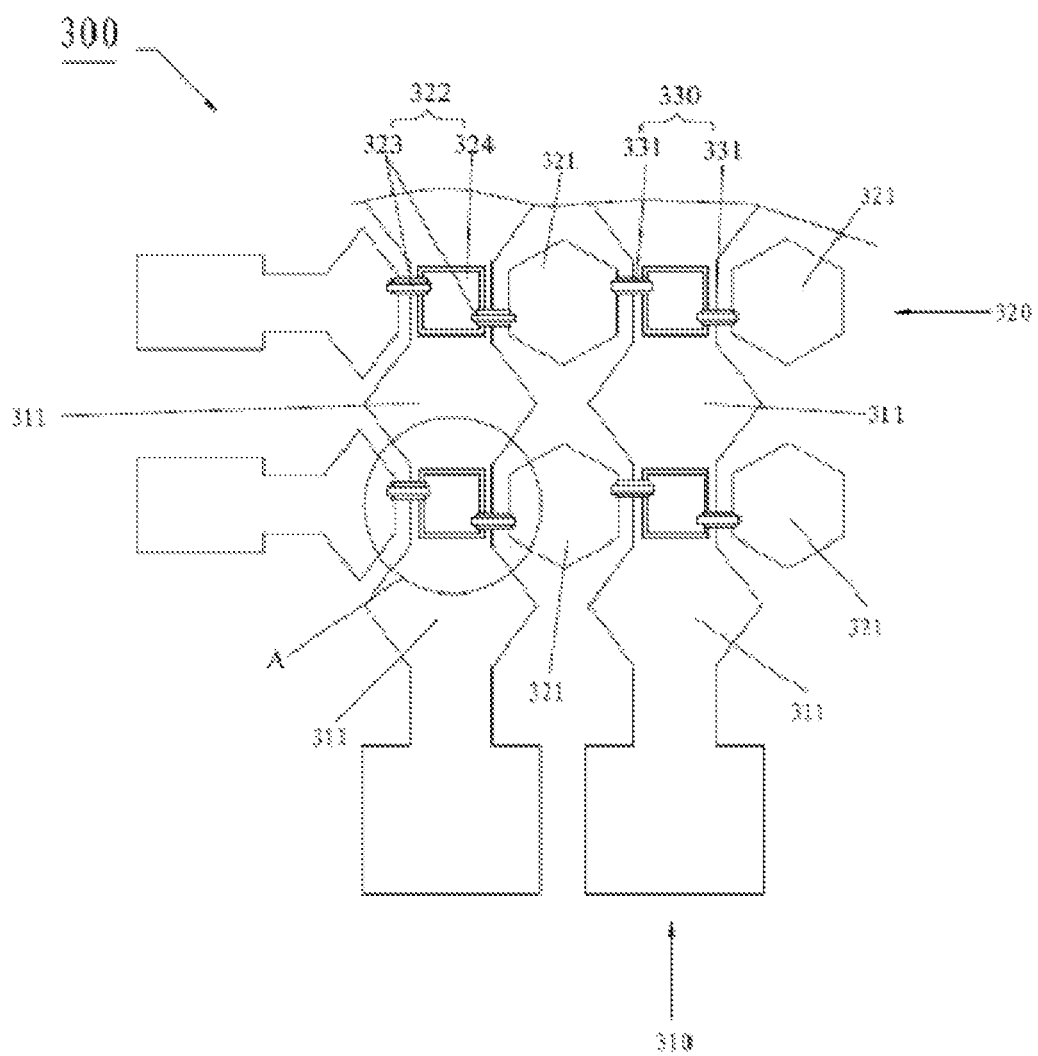
FIG. 1 is a schematic view of the electrode structure of the present invention.

FIG. 1 shows the electrode structure. The electrode structure 300 of capacitive touch panel is disposed on a substrate (not shown), such as glass. The electrode structure 300 comprises a plurality of first conductive cells 311 and second conductive cells 312, which are separated from each other. The first conductive cells 311 constitute at least one group of first electrode groups 310, while the second conductive cells 312 constitute at least one group of second electrode groups 320. The first electrode groups 310 are insulated from the second electrode groups 320. Two adjacent first conductive cells 311 in any one first electrode group 310 are connected by a plurality of first conductive lines 312, and two adjacent second conductive cells 321 in any one second electrode group 320 are connected by a plurality of second conductive lines 322. A plurality of signal traces (not shown) disposed on the border of the electrode structure connect the first electrode cells 311 and the second electrode cells 321 to a controller (not shown) to transmit touch sensing signals.

Figure 2:
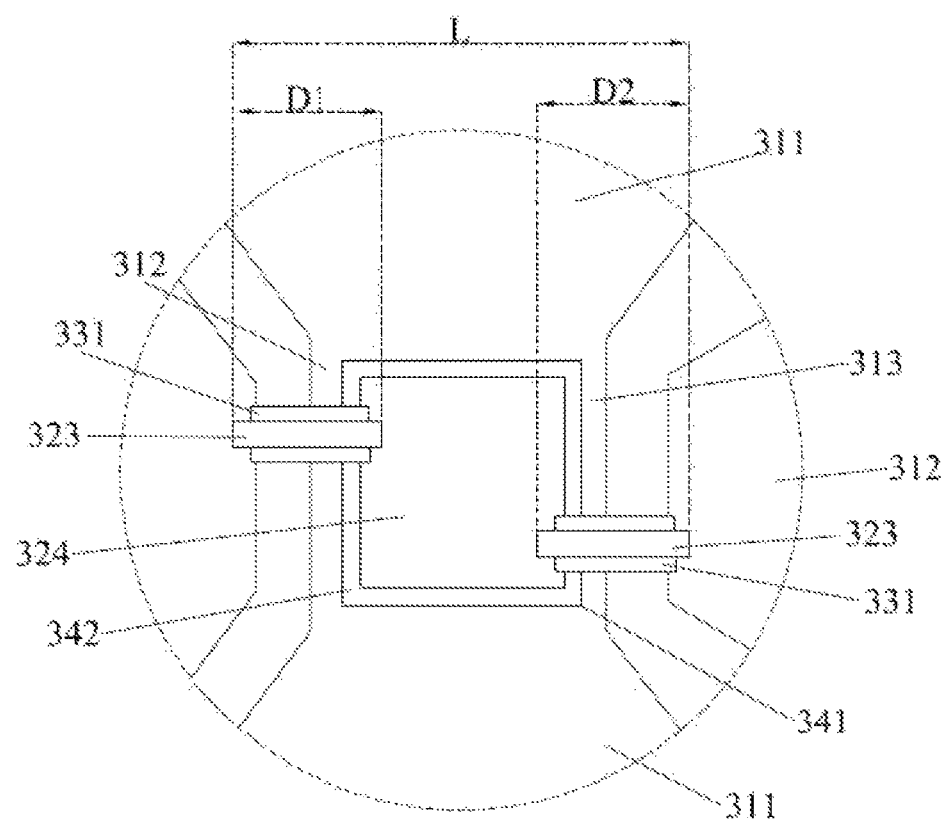
FIG. 2 is a schematic enlarged view of part A of FIG. 1.

Referring to FIG. 1 as well as FIG. 2, each second conductive line 322 includes a conducting element 324 and a pair of second conductive branches 323. A window 341 is formed in each first conductive line 312, and a conducting element 324 is located in each window 341. A closed gap 342 is formed between each first conductive line 312 and the conducting elements 324 in related first conductive line 312 to make the first conductive line 312 be separated and insulated from the conducting element 324. Two second conductive branches 323 in each pair of second conductive branches 323 are disposed at two sides of the conducting element 324 and connect the conducting element 324 to two adjacent second conductive cells 321. In other word, one end of each individual second conductive branch 323 connects one conducting element 324, while another end of it connects one second conductive cell 321. Therefore, the second conductive cells 321 in one of the second electrode groups 320 are connected by pairs of second conductive branches 323 and the conducting elements 324 in series to transmit the touch sensing signals to the controller.

Each second conductive branch 323, intersected with the first conductive line 312, is insulated from the first conductive lines 312 by an insulating layer 330. The insulating layer 330 made of transparent insulating material includes a plurality of insulating elements 331 located at the intersection of each second conductive branch 323 and the first conductive line 312, by which the each second conductive branch 323 is insulated from the first conductive lines 312.

The first conductive cells 311 and the second conductive cells 321 are all placed on the same surface of the substrate (not shown), so the first electrode groups 310 and the second electrode groups 320 are placed on the surface of the substrate. Thus, the thickness of touch panel including the electrode structure 300 can be reduced, and the manufacturing process can be simplified.

When the touch panel with the electrode structure 300 of the present invention is touched, the touch location covers at least one first conductive cell 311 of the first electrode groups 310 and at least one second conductive cell 321 of the second electrode groups 320. A mutual capacitance created between the covered first conductive cell 311 and the covered second conductive cell 321 indicates a touch signal which is transmitted to the controller by the signal traces. Thus, the touch location is calculated and determined by the controller.

The first conductive cells 311, the second conductive cells 321, the first conductive lines 312, the conducting elements 324 and the individual second conductive lines 323 are made of transparent conductive materials, which can be selected from a group of Indium Tin Oxide (ITO), Indium Zinc Oxide (IZO) or Aluminum Zinc Oxide (AZO). Besides, the conducting elements 324 can be made of metal.

The geometrical shape of the first conductive cells 311 and the second conductive cells 312 can be diamond, hexagon, octagon, rectangle, triangle and so on.

Another embodiment of the present invention is provided, the difference of which in contrast with the above-mentioned embodiment is that the first conductive lines 312 and the pairs of second conductive branches 323 are placed in reverse order. The pairs of second conductive branches 323 are placed on the surface of the substrate. The insulating elements 331 are located on the pairs of second conductive branches 323. The first conductive lines 312 are placed on the insulating elements 331.

The pairs of second conductive branches 323 are preferably made of metal, such as copper, silver, aluminum and so on. Because of the better connectivity of metal than that of ITO, the connectivity of the pairs of second conductive branches 323 is increased to prevent them from cracking at junction of the pairs of second conductive branches 323 and the insulating elements 331. Besides, the conductivity of metal is also better than that of ITO. As each pair of second conductive branches 323 is connected by the conducting element 324, the length D1+D2 of two second conductive branches 323 is less than the distance L between two adjacent second conductive cells 321, which reduces the visibility of the second conductive branches 323.

According to various design requirements, the two second conductive branches 323 belonging to each pair of second conductive lines 322 can be aligned or staggered with each other. Besides, the location and size of the second conductive branches 323 can be adjusted. For each second conductive line 322, the number of the pairs of the second conductive branches 323 can be more than one. The more the pairs of the second conductive branches 323, the better the conductivity of the second conductive lines 322 is. If one of the second conductive branches 323 is broken, the other one can still keep the second electrode groups 320 working as usual.

The electrode structure 300 provided by the present invention can be formed on a substrate by etching, sputtering, printing and so on. Etching the electrode structure 300 is taken as an example to describe a method of forming the electrode structure 300 on the substrate. The method includes the following steps:

Firstly, a conductive film (such as 110) is coated on a cleaned substrate (such as glass). On the surface of the conductive film, a mask is printed by screen printing to cover parts of the conductive film and etch the uncovered parts of that. After etching, the first conductive cells 311, the second conductive cells 321 and the first conductive lines 312 connecting adjacent first conductive cells 311 are formed on the substrate. Furthermore, the window 341 is formed in each first conductive line 312.

Secondly, each conducting element 324 is formed in each window 341 and the closed gap 342 is formed to insulate each conducting element 324 from each related first conductive line 312. In preferred embodiment, when the material of the conducting elements 324 is the same as that of the first conductive cells 311, the second conductive cells 321 and the first conductive lines 312, the conducting elements 324 can be formed by etching simultaneously when the first conductive cells 311, the second conductive cells 321 and the first conductive lines 312 are formed in former step. Thus, the steps of forming the electrode structure 300 can be reduced.

Thirdly, an insulating layer 330 including a plurality of insulating elements 331 is formed on the etched conductive film. Each insulating element 331 is located on the first conductive lines 312. The insulating elements 331 are made of transparent insulating material.

Finally, the second conductive branches 323 are formed on the insulating elements 331. One end of each second conductive branch 323 connects the second conductive cell 321, while the other end connects the conducting element 324, so that the second conductive cells 321 can be connected in series.

Furthermore, the method of forming the electrode structure 300 includes a step of forming the signal traces on the border of the electrode structure 300. The first electrode cells 310 and the second electrode cells 320 connect to the periphery signal traces respectively (not shown).

The method of forming the electrode structure 300 provided in another embodiment can be implemented in reversed order. Firstly, the second conductive branches 323 are formed on a substrate; secondly, a plurality of insulating elements 331 of the insulating layer 330 is formed on the second conductive branches 323; thirdly, the first conductive cells 311, the second conductive cells 321, the first conductive lines 312 and the conducting elements 324 are formed on the substrate, the first conductive lines 312 are located on the insulating elements 331.

Moreover, the present invention also provides a touch panel including the electrode structure 300. The touch panel includes a substrate (not shown), such as glass, the electrode structure 300 for generating touch sensing signals, and a controller (not shown) for receiving and processing the touch sensing, signals.

While certain embodiments have been shown and described, various modifications and substitutions may be made thereto without departing from the spirit and scope of the invention. Therefore, it is to be understood that the present invention has been described by way of illustration and not limitations.

What is claimed is:

1. A method of forming an electrode structure, comprising steps of:
   a) forming a plurality of first conductive cells, a plurality of first conductive lines connecting adjacent said first conductive cells and a plurality of second conductive cells;
   b) forming a plurality of conducting elements insulated from said first conductive lines;
   c) forming a plurality of pairs of second conductive branches over said first conductive lines to connect said second conductive cells with said conducting elements;
   wherein a window is formed in each said first conductive line in said step a); and each said conducting element is located in said window with a closed gap formed between said conducting element and said first conductive line in step b).

2. The method of forming an electrode structure of claim 1, further comprising a step of forming an insulating layer between said first conductive lines and said second conductive branches.

3. The method of forming an electrode structure of claim 2, wherein said insulating layer comprises a plurality of insulating elements.

4. The method of forming an electrode structure of claim 1, wherein said step a) and said step b) are implemented together.

5. The method of forming an electrode structure of claim 1, further comprising a step of forming a plurality of signal traces connecting said first conductive cells and said second conductive cells on border of said electrode structure.

6. The method of forming an electrode structure of claim 1, further comprising a step of forming a transparent insulating layer between said first conductive lines and said second conductive branches.

7. The method of forming an electrode structure of claim 1, further comprising a step of forming a plurality of transparent insulating elements, wherein each of said transparent insulating elements is located at the intersection of each of said second conductive branches and the corresponding first conductive line.

8. The method of forming an electrode structure of claim 1, wherein said step a) comprises the steps of:
   coating a conductive film on a substrate; and
   etching the conductive film to form said first conductive cells, said first conductive lines connecting adjacent said first conductive cells and said second conductive cells.

9. The method of forming an electrode structure of claim 8, wherein said conductive film is a transparent conductive film.

10. The method of forming an electrode structure of claim 9, wherein said transparent conductive film is Indium Tin Oxide (ITO), Indium Zinc Oxide (IZO) or Aluminum Zinc Oxide (AZO).

11. The method of forming an electrode structure of claim 1, wherein said step b) comprises the step of: coating a transparent conductive film on a substrate to form said conducting elements.

12. The method of forming an electrode structure of claim 1, wherein said step b) comprises the step of: coating a metal on a substrate to form said conducting elements.

13. The method of forming an electrode structure of claim 1, wherein said step c) comprises the step of: coating a metal to form said second conductive branches.

14. The method of forming an electrode structure of claim 13, wherein said metal is copper, silver or aluminum.

15. The method of forming an electrode structure of claim 1, wherein said method is implemented in an order of said step a), said step b), and said step c), or in a reversed order of said step c), said step b), and said step a).

* * * * *